United States Patent
Chen

(10) Patent No.: US 12,417,805 B2
(45) Date of Patent: Sep. 16, 2025

(54) MEMORY CONTROL CIRCUIT CAPABLE OF GENERATING AN UPDATED REFERENCE CURRENT

(71) Applicant: UNITED MICROELECTRONICS CORP., Hsin-Chu (TW)

(72) Inventor: Chung-Hao Chen, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 198 days.

(21) Appl. No.: 18/370,866

(22) Filed: Sep. 20, 2023

(65) Prior Publication Data

US 2025/0061944 A1    Feb. 20, 2025

(30) Foreign Application Priority Data

Aug. 14, 2023   (TW) ................................ 112130409

(51) Int. Cl.
*G11C 11/00* (2006.01)
*G11C 13/00* (2006.01)

(52) U.S. Cl.
CPC ........ *G11C 13/004* (2013.01); *G11C 13/0038* (2013.01); *G11C 2213/79* (2013.01)

(58) Field of Classification Search
CPC .............. G11C 13/004; G11C 13/0038; G11C 2213/79; G11C 2013/0078; G11C 13/0069
USPC ....................................................... 365/148
See application file for complete search history.

(56) References Cited

U.S. PATENT DOCUMENTS

| | | | |
|---|---|---|---|
| 6,967,884 B2 | 11/2005 | Hsu | |
| 7,479,807 B1* | 1/2009 | Cheng | H03K 19/00384 |
| | | | 326/98 |
| 9,000,837 B1* | 4/2015 | Fifield | G11C 29/028 |
| | | | 327/306 |
| 9,418,761 B2* | 8/2016 | Arslan | G11C 13/004 |
| 9,520,189 B1 | 12/2016 | Papandreou | |

(Continued)

OTHER PUBLICATIONS

Chang, "A High-Speed 7.2-ns Read-Write Random Access 4-Mb Embedded Resistive RAM (ReRAM) Macro Using Process-Variation-Tolerant Current-Mode Read Schemes", IEEE Journal of Solid-State Circuits, vol. 48, No. 3, Mar. 2013.

(Continued)

*Primary Examiner* — Tha-O H Bui
(74) *Attorney, Agent, or Firm* — Winston Hsu

(57) ABSTRACT

A memory control circuit includes a leakage current providing circuit, a current mirror circuit, an operational circuit and a reference current adjustment circuit. The leakage current providing circuit is used to receive a control signal and provide a leakage current when the control signal has a first enable signal level. The current mirror circuit is used to generate a control current according to the leakage current. The operational circuit is used to generate an enable signal. When the control current is larger than a predetermined value, the enable signal has a second enable signal level. The reference current adjustment circuit is coupled to the operational circuit. When the enable signal has the second enable signal level, the reference current adjustment circuit generates an updated reference current according to a reference current and an adjustment current. The updated reference current is used to determine a resistance of a memory.

17 Claims, 7 Drawing Sheets

(56) References Cited

U.S. PATENT DOCUMENTS

| | | |
|---|---|---|
| 9,747,980 B2 | 8/2017 | Lee |
| 2023/0298663 A1* | 9/2023 | Chun .................... G06N 3/065 365/189.15 |

OTHER PUBLICATIONS

Chou, "A 22nm 96KX144 RRAM macro with a self-tracking reference and a low ripple charge pump to achieve a configurable read window and a wide operating voltage range", TSMC, HsinChu, Taiwan, email: yctsoua@tsmc.com, 2020.

Yang, "A 14nm-FinFET 1Mb Embedded 1T1R RRAM with a 0.022µm2 Cell Size Using Self-Adaptive Delayed Termination and Multi-Cell Reference", 2021 IEEE International Solid-State Circuits Conference (ISSCC 2021 / Session 24 / Advanced Embedded Memories / 24.2), 2021.

* cited by examiner

MEMORY CONTROL CIRCUIT CAPABLE OF GENERATING AN UPDATED REFERENCE CURRENT

BACKGROUND OF THE INVENTION

1. Field of the Invention

The disclosure is related to a memory control circuit, and more particularly, a memory control circuit capable of generating an updated reference current where a resistance of a memory is determined according to the updated reference current for improving the accuracy of reading the memory.

2. Description of the Prior Art

With the advancement of memory technology, the requirements of memories are getting higher. In the field, faster memory reading and writing, lower power consumption, simpler memory structure, longer data storage time, higher reliability of repeated accesses, and lower cost are pursued. Currently, resistive random access memory (RRAM) can support non-volatile data access.

However, it has been observed in practice that current memory designs have some shortcomings. When the temperature increases, the accuracy of reading a memory often decreases because the current value corresponding to the resistance of the memory changes. An effective solution is still in need to improve reading accuracy at higher temperatures.

SUMMARY OF THE INVENTION

An embodiment provides a memory control circuit including a leakage current providing circuit, a current mirror circuit, an operation circuit and a reference current adjustment circuit. The leakage current providing circuit can be used to generate a leakage current, and include a first terminal configured to receive a control signal, and a second terminal configured to provide the leakage current when the control signal has a first enable signal level. The current mirror circuit can be used to generate a control current according to the leakage current. The current mirror circuit can include a first terminal coupled to the second terminal of the leakage current providing circuit, and a second terminal configured to output the control current. The operation circuit can be used to generate an enable signal. The operation circuit can include a first terminal coupled to the second terminal of the current mirror circuit, and a second terminal configured to output the enable signal. The enable signal has a second enable signal level when the control current is larger than a predetermined value. The reference current adjustment circuit can be coupled to the second terminal of the operation circuit and be used to generate an updated reference current according to a reference current and an adjustment current when the enable signal has the second enable signal level. A resistance of a memory is determined according to the updated reference current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
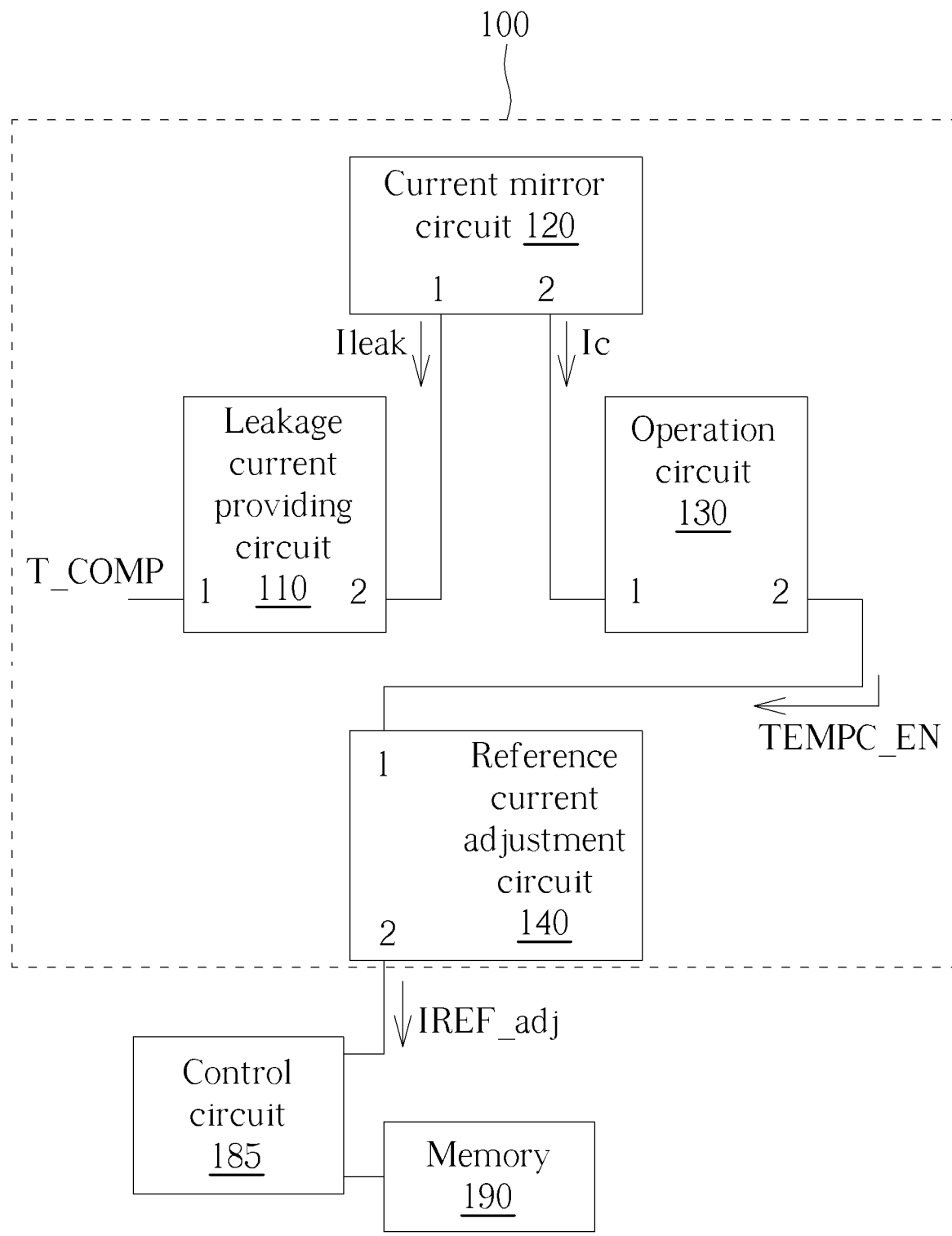
FIG. 1 illustrates a memory control circuit coupled to a control circuit for controlling a memory according to an embodiment.

In the drawings, a drain terminal, a source terminal and a gate terminal of a transistor can be denoted as D. S and G respectively. A first terminal and a second terminal of a circuit can be denoted as 1 and 2 respectively. Herein, a control terminal of a transistor can be a gate terminal of the transistor, a first terminal of the transistor can be one of a drain terminal and a source terminal of the transistor, and a second terminal of the transistor can be the other one of the drain terminal and the source terminal of the transistor. For example, a first terminal and a second terminal of a transistor can be a drain terminal and a source terminal respectively. In another example, a first terminal and a second terminal of a transistor can be a source terminal and a drain terminal respectively. In the drawings, drain terminals (D), source terminals(S) and gate terminals (G) of transistors are drawn as examples. Reasonable design changes made according to the characteristics of transistors are still within the scope of embodiments. Herein, a resistive memory cell can be set to have different resistances for storing different logic values.

FIG. 1 illustrates a memory control circuit 100 coupled to a control circuit 185 for controlling a memory 190 according to an embodiment. The memory 100 can include a leakage current providing circuit 110, a current mirror circuit 120, an operation circuit 130 and a reference current adjustment circuit 140.

The leakage current providing circuit 110 can include a first terminal and a second terminal, where the first terminal can be used to receive a control signal T_COMP, and the second terminal can be used to induce a leakage current Ileak when the control signal T_COMP has an enable signal level (e.g. high signal level). The signal level of the control signal T_COMP can be set according to requirements. When the control signal T_COMP is set to have the enable signal level (e.g. high level), the leakage current providing circuit 110 can provide the leakage current Ileak.

The current mirror circuit 120 can be used to generate a control current Ic according to the leakage current Ileak. The current mirror circuit 120 can include a first terminal and a second terminal, where the first terminal can be coupled to the second terminal of the leakage current providing circuit 110 for the leakage current Ileak to flow through, and the second terminal can be used to output the control current Ic.

The operation circuit 130 can be used to generate an enable signal TEMPC_EN. The operation circuit 130 can include a first terminal and a second terminal, where the first terminal can be coupled to the second terminal of the current mirror circuit 120, and the second terminal can be used to output the enable signal TEMPC_EN. The enable signal TEMPC_EN can have an enable signal level (e.g. high signal level) when the control current Ic is larger than a predetermined value.

The reference current adjustment circuit 140 can include a first terminal and a second terminal, where the first terminal can be coupled to the second terminal of the operation circuit 130, and the second terminal can be used to output an updated reference current IREF_adj. When the enable signal TEMPC_EN has the enable level (e.g. high signal level), the reference current adjustment circuit 140 can generate the updated reference current IREF_adj according to a reference current IREF and an adjustment current Ia mentioned below.

As shown in FIG. 1, the updated reference current IREF_adj can be inputted to the control circuit 185, and the memory 190 can be read by determining a resistance of the memory 190 according to the updated reference current IREF_adj.

For example, the control circuit 185 can include a sense amplifier used for a memory. The memory 190 can include a memory array formed of a plurality of resistive random access memory (RRAM) cells. The RRAM cells in the memory 190 can be coupled to the same bit line and the same source line to perform operations such as reading and writing.

The updated reference current IREF_adj can be used for temperature compensation, and the updated reference current IREF_adj can vary with temperature. For example, the updated reference current IREF_adj can increase when the temperature rises to improve the accuracy of reading the memory 190. More details are described below.

According to embodiments, the enable signal level of the control signal T_COMP and the enable signal level of the enable signal TEMPC_EN can be the same or different.

Figure 2:
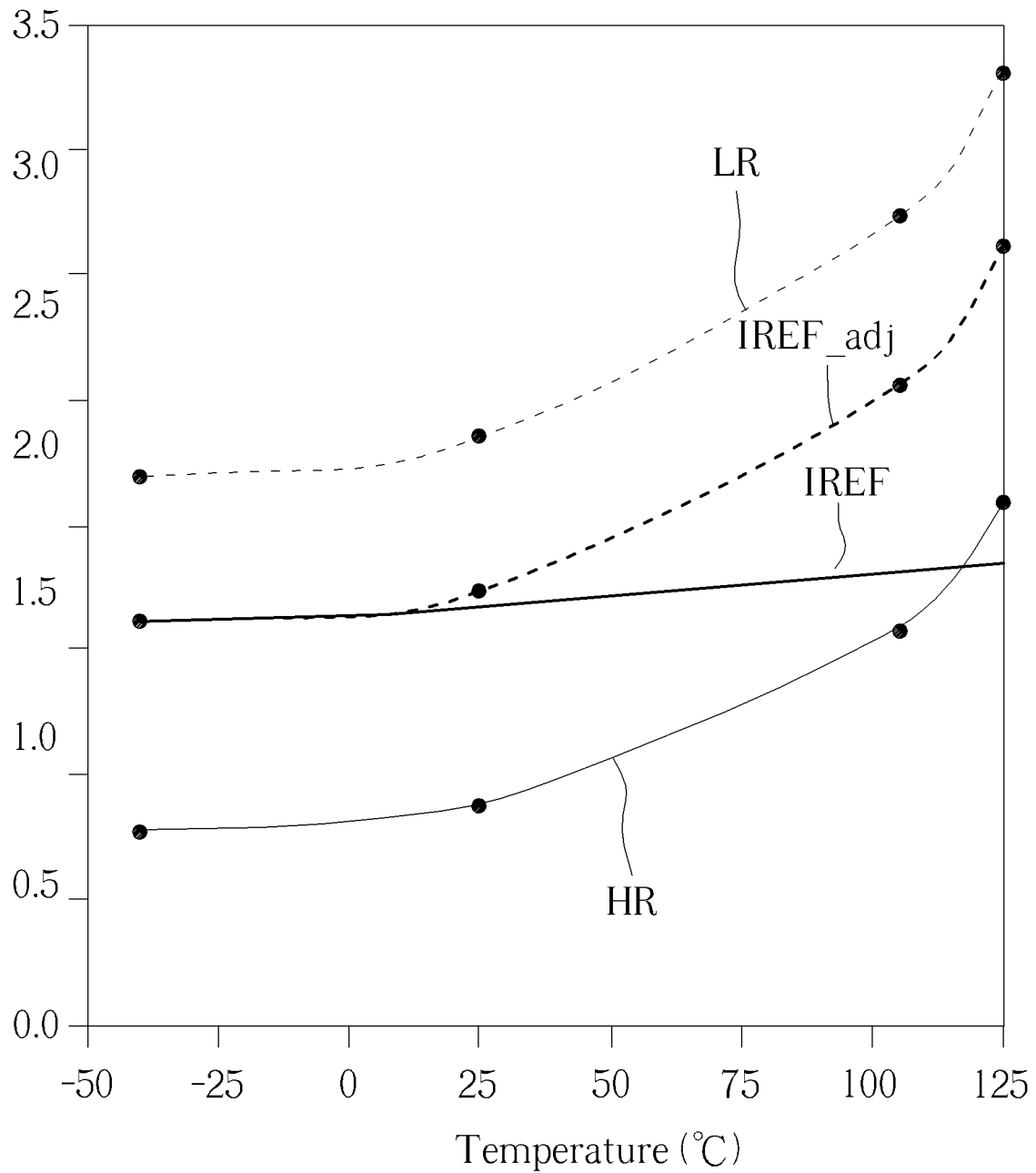
FIG. 2 illustrates that a resistance of a memory can be determined according to an updated reference current according to an embodiment.

FIG. 2 illustrates that the resistance of a memory can be determined according to the updated reference current IREF_adj according to an embodiment. In FIG. 2, the horizontal axis represents the temperature of the memory, and the vertical axis represents the current corresponding to the memory cell in the memory. The unit of the horizontal axis can be degree Celsius (° C.), and the unit of the vertical axis can be an arbitrary unit (a.u.) defined and adjusted by the user according to requirements. If a measured current corresponding to the resistance of the memory is higher than the updated reference current IREF_adj, the measured current can be shown as the current LR, and the resistance of the memory can be determined as a low resistance. If a measured current corresponding to the resistance of the memory is lower than the updated reference current IREF_adj, the measured current can be shown as the current HR, and the resistance of the memory can be determined as a high resistance.

As shown in FIG. 2, the original reference current IREF varies less with the temperature, so the currents LR and HR are both higher than the reference current IREF at a high temperature. Hence, the currents LR and HR cannot be distinguished at the high temperature, reducing the accuracy of reading the memory at the high temperature. In FIG. 2, the updated reference current IREF_adj can increase when the temperature rises, so the curves of the currents LR and HR can be located above and below the curve of the updated reference current IREF_adj respectively. As a result, the currents LR and HR can be distinguished at the high temperature, and the accuracy of reading the memory is improved.

Figure 3:
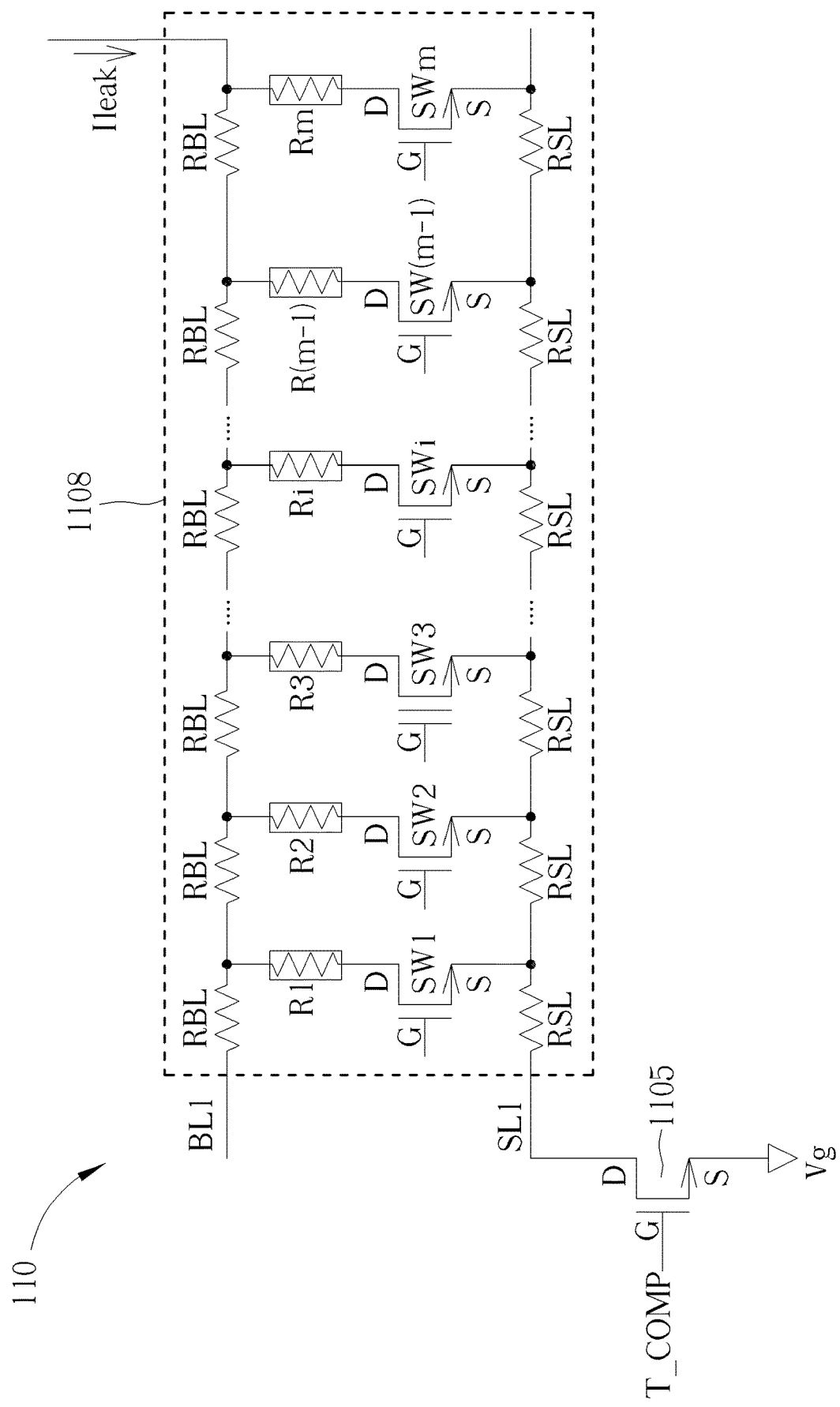
FIG. 3 illustrates the leakage current providing circuit in FIG. 1.

FIG. 3 illustrates the leakage current providing circuit 110 in FIG. 1. The leakage current providing circuit 110 can include a switch 1105 and a leakage current generation circuit 1108. The switch 1105 can include a control terminal, a first terminal and a second terminal, where the control terminal can be coupled to the first terminal of the leakage current providing circuit 110 to receive the control signal T_COMP, and the second terminal can be coupled to a first reference voltage terminal to receive a first reference voltage Vg. The first reference voltage Vg can be a ground voltage, a low reference voltage or an appropriate reference voltage. The switch 1105 can include a transistor, and the control terminal, the first terminal and the second terminal of the transistor can be a gate terminal, a drain terminal and a source terminal respectively.

As shown in FIG. 3, the leakage current generation circuit 1108 can further include a first source line SL1, a first bit line BL1, m resistive memory cells R1 to Rm, and m sub-switches SW1 to SWm. The first source line SL1 can be coupled to the first terminal of the switch 1105 of the leakage current generation circuit 110. The first bit line BL1 can be coupled to the second terminal of the leakage current generation circuit 110. An ith resistive memory cell Ri and an ith sub-switch SWi can be coupled in series between the first source line SL1 and the first bit line BL1, m and i are integers, and 0<i≤m. As shown in FIG. 3, on the first bit line BL1, resistors RBL can be disposed, and each resistor RBL other than the first one can be coupled to terminals of two resistive memory cells. On the first source line SL1, resistors RSL can be disposed, and each resistor RSL other than the first one can be coupled to terminals of two sub-switches.

In FIG. 3, the signal level of the control signal T_COMP can be determined by a user. When the control signal T_COMP has the enable signal level (e.g. high signal level), the sub-switches SW1 to SWm of the leakage current generation circuit 1108 can be optionally turned off, so the leakage current generation circuit 1108 can induce the leakage current Ileak.

Figure 4:
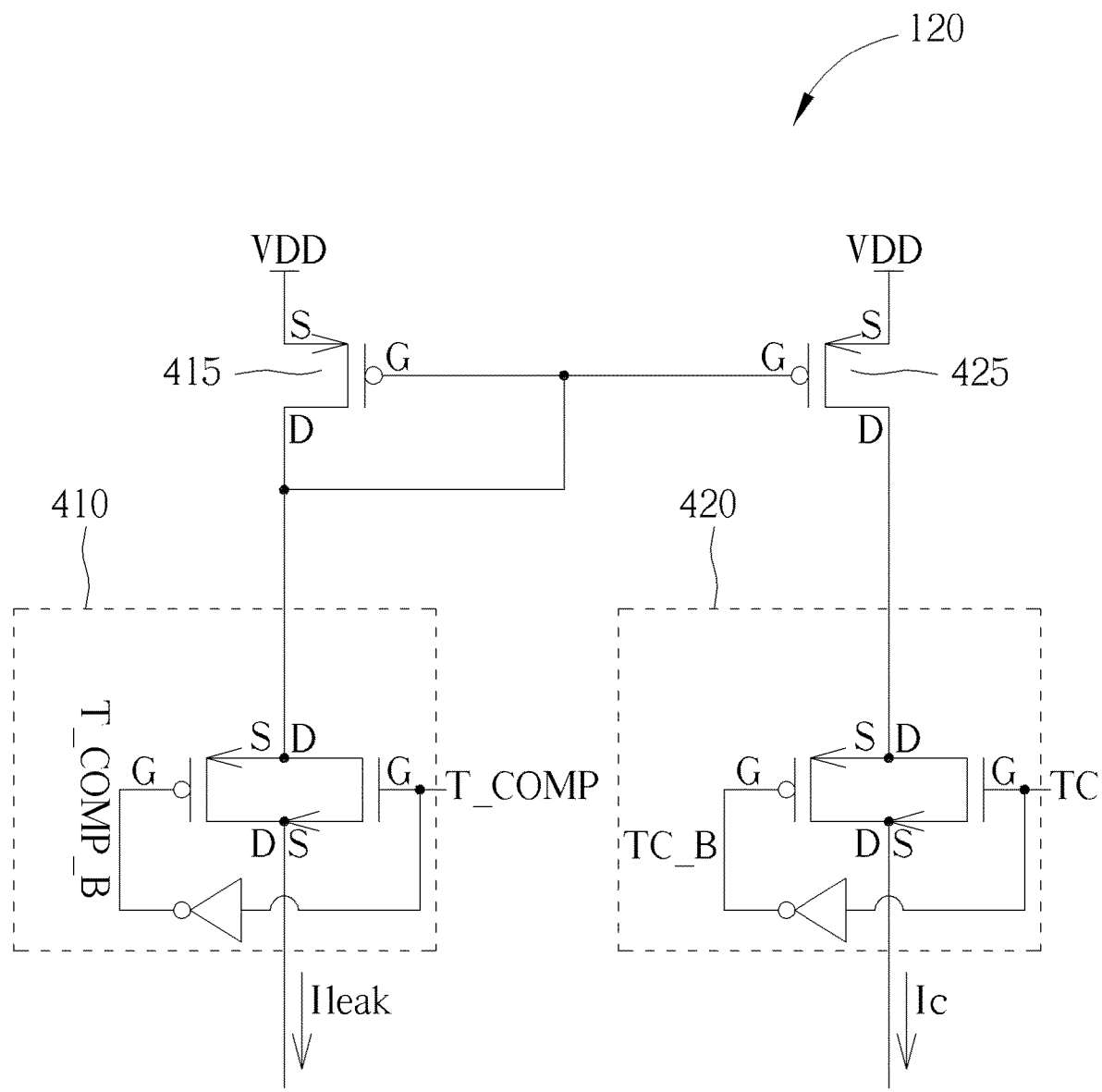
FIG. 4 illustrates the current mirror circuit in FIG. 1.

FIG. 4 illustrates the current mirror circuit 120 in FIG. 1. The current mirror circuit 120 can include a first switch 410, a first transistor 415, a second switch 420 and a second transistor 425.

The first switch 410 can include a control terminal, a first terminal and a second terminal, where the control terminal can be used to receive the control signal T_COMP, and the second terminal can be coupled to the first terminal of the current mirror circuit 120 for the leakage current Ileak to flow through.

The first transistor 415 can include a first terminal, a second terminal and a control terminal, where the first terminal can be coupled to a second reference voltage terminal to receive a second reference voltage VDD, and the second terminal can be coupled to the first terminal of the first switch 410. The second reference voltage VDD can be a high reference voltage or an appropriate reference voltage.

The second transistor 425 can include a first terminal, a second terminal and a control terminal, where the first terminal can be coupled to the second reference voltage terminal, and the control terminal can be coupled to the control terminal and the second terminal of the first transistor 415.

The second switch 420 can include a first terminal, a second terminal and a control terminal, where the first terminal can be coupled to the second terminal of the second transistor 425, the second terminal can be coupled to the second terminal of the current mirror circuit 120 for the control current Ic to flow through, and the control terminal can be used to receive a temperature signal TC.

In FIG. 4, when the control signal T_COMP has the enable signal level (e.g. high signal level), the first switch 410 can be turned on. When the temperature signal TC has an enable signal level (e.g. high signal level), the second switch 420 can be turned on, and the current mirror circuit 120 can generate the control current Ic.

When the first switch 410 and the second switch 420 are turned on, the first transistor 415 and the second transistor 425 can form a current mirror structure to generate the control current Ic according to the leakage current Ileak.

For example, the first transistor 415 and the second transistor 425 can be P-type transistors, and their first terminals, second terminals and control terminals can be source terminals, drain terminals and gate terminals respectively.

The first switch 410 can be formed of two transistors and an invertor, where one can be an N-type transistor, and the other can be a P-type transistor. The gate terminal of the N-type transistor of the first switch 410 can be the control terminal of the first switch 410 used to receive the control signal T_COMP. The gate terminal of the P-type transistor of the first switch 410 can be used to receive a control signal T_COMP_B complementary with the control signal T_COMP. The control signal T_COMP can be inputted to the invertor to generate the control signal T_COMP_B. When the control signal T_COMP has the enable signal level (e.g. high signal level), the first switch 410 can be turned on for the leakage current Ileak to flow through the first switch 410.

Like the first switch 410, the second switch 420 can include an N-type transistor, a P-type transistor and an invertor. A gate terminal of the N-type transistor can be the control terminal of the first switch 410 used to receive the temperature signal TC. A gate terminal of the P-type transistor can receive a temperature signal TC_B complementary with the temperature signal TC. The temperature signal TC can be inputted to the invertor to generate the temperature signal TC_B. When the temperature signal TC has the enable signal level (e.g. high signal level), the second switch 420 can be turned on for the control current Ic to flow through the second switch 420.

Figure 5:
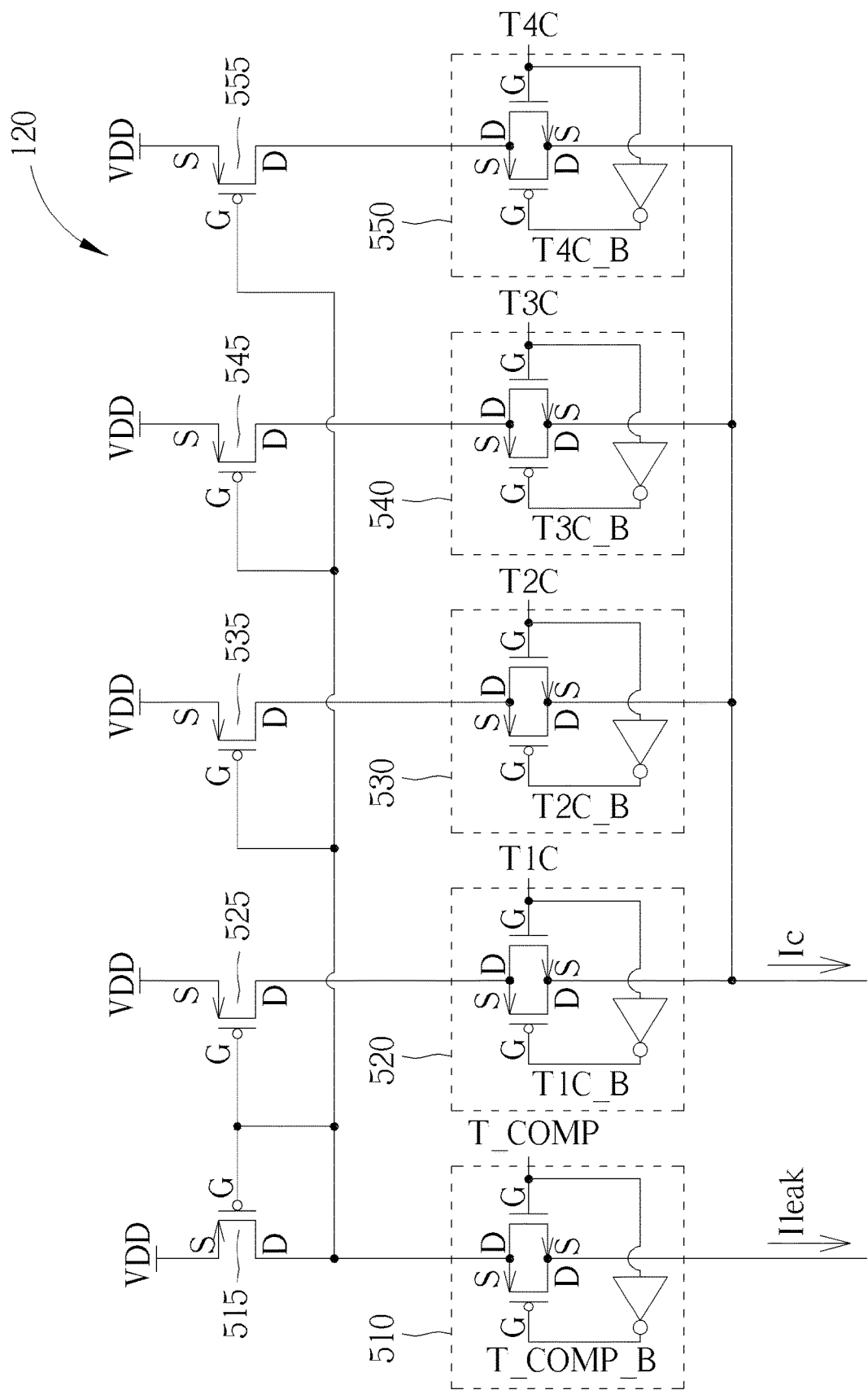
FIG. 5 illustrates the current mirror circuit according to another embodiment.

FIG. 5 illustrates the current mirror circuit 120 according to another embodiment. The current mirror circuit 120 in FIG. 5 can include a first switch 510, a second switch 520, a third switch 530, a fourth switch 540, a fifth switch 550, a first transistor 515, a second transistor 525, a third transistor 535, a fourth transistor 545 and a fifth transistor 555.

The first switch 510 can include a control terminal, a first terminal and a second terminal, where the control terminal can be used to receive the control signal T_COMP, and the second terminal can be coupled to the first terminal of the current mirror circuit 120 for the leakage current Ileak to flow through.

The first transistor 515 can include a control terminal, a first terminal and a second terminal, where the first terminal can be coupled to the second reference voltage terminal to receive the second reference voltage VDD, and the second terminal can be coupled to the first terminal of the first switch 510.

The second transistor 525 can include a control terminal, a first terminal and a second terminal, where the first terminal can be coupled to the second reference voltage terminal to receive the second reference voltage VDD, and the control terminal can be coupled to the control terminal and the second terminal of the first transistor 515 to form a current mirror structure.

The second switch 520 can include a control terminal, a first terminal and a second terminal, where the first terminal can be coupled to the second terminal of the second transistor 525, the second terminal can be coupled to the second terminal of the current mirror circuit 120, and the control terminal can be used to receive a first temperature signal T1C.

The third transistor 535 can include a control terminal, a first terminal and a second terminal, where the first terminal can be coupled to the second reference voltage terminal to receive the second reference voltage VDD, and the control terminal can be coupled to the control terminal and the second terminal of the first transistor 515 to form a current mirror structure.

The third switch 530 can include a control terminal, a first terminal and a second terminal, where the first terminal can be coupled to the second terminal of the third transistor 535, the second terminal coupled to the second terminal of the current mirror circuit 120, and the control terminal can be used to receive a second temperature signal T2C.

The fourth transistor 545 can include a control terminal, a first terminal and a second terminal, where the first terminal can be coupled to the second reference voltage terminal to receive the second reference voltage VDD, and the control terminal can be coupled to the control terminal and the second terminal of the first transistor 515 to form a current mirror structure.

The fourth switch 540 can include a control terminal, a first terminal and a second terminal, where the first terminal can be coupled to the second terminal of the fourth transistor 545, the second terminal coupled to the second terminal of the current mirror circuit 120, and the control terminal can be used to receive a third temperature signal T3C.

The fifth transistor 555 can include a control terminal, a first terminal and a second terminal, where the first terminal can be coupled to the second reference voltage terminal to receive the second reference voltage VDD, and the control terminal can be coupled to the control terminal and the second terminal of the first transistor 515 to form a current mirror structure.

The fifth switch 550 can include a control terminal, a first terminal and a second terminal, where the first terminal can be coupled to the second terminal of the fifth transistor 555, the second terminal can be coupled to the second terminal of the current mirror circuit 120, and the control terminal can be used to receive a fourth temperature signal T4C.

The first temperature signal T1C, the second temperature signal T2C, the third temperature signal T3C and the fourth temperature signal T4C can be corresponding to a first temperature (expressed as T1 in the text), a second temperature (expressed as T2 in the text), a third temperature (expressed as T3 in the text) and a fourth temperature (expressed as T4 in the text) respectively. The first temperature T1, the second temperature T2, the third temperature T3 and the fourth temperature T4 can be different.

For example, the first temperature T1 can be lower than the second temperature T2. The second temperature T2 can be lower than the third temperature T3. The third temperature T3 can be lower than the fourth temperature T4.

For example, the first temperature T1 can be 60° C., the second temperature T2 can be 75° C., the third temperature T3 can be 90° C. and the fourth temperature T4 can be 105° C.

Like FIG. 4, each of the first switch 510 to the fifth switch 550 can be formed of a P-type transistor and an N-type transistor coupled to one another.

In the first switch 510, a gate terminal of an N-type transistor can receive the control signal T_COMP, and a gate terminal of a P-type transistor can receive a control signal T_COMP_B complementary with the control signal T_COMP.

In the second switch 520, a gate terminal of an N-type transistor can receive the first temperature signal T1C, and a gate terminal of a P-type transistor can receive a temperature signal T1C_B complementary with the first temperature signal T1C.

In the third switch 530, a gate terminal of an N-type transistor can receive the second temperature signal T2C, and a gate terminal of a P-type transistor can receive a temperature signal T2C_B complementary with the second temperature signal T2C.

In the fourth switch 540, a gate terminal of an N-type transistor can receive the third temperature signal T3C, and a gate terminal of a P-type transistor can receive a temperature signal T3C_B complementary with the third temperature signal T3C.

In the fifth switch 550, a gate terminal of an N-type transistor can receive the fourth temperature signal T4C, and a gate terminal of a P-type transistor can receive a temperature signal T4C_B complementary with the fourth temperature signal T4C.

The specifications and sizes of transistors of the second switch 520, the third switch 530, the fourth switch 540 and the fifth switch 550 can be determined according to simulations in the circuit design stage, so the current mirror circuit 120 can generate the control current Ic according to the leakage current Ileak at specific temperatures.

Below, the operations are described with an example where the first temperature T1 can be 60° C., the second temperature T2 can be 75° C., the third temperature T3 can be 90° C. and the fourth temperature can be 105° C. The mentioned temperatures are examples and the temperatures can be adjusted according to requirements and the specifications of transistors.

As shown in Table 1, by adjusting the first temperature signal T1C, the second temperature signal T2C, the third temperature signal T3C and the fourth temperature signal T4C, the conditions of the enable signal TEMPC_EN having the enable signal level can be set.

signal level (e.g. high signal level), the first temperature signal T1C is higher than the threshold, the second temperature signal T2C, the third temperature signal T3C and the fourth temperature signal T4C are lower than the threshold, and the operation temperature of the current mirror circuit 120 is higher than the first temperature T1.

As described in Table 1, FIG. 1 and FIG. 5, the enable signal TEMPC_EN generated by the operation circuit 130 in FIG. 1 has the enable signal level (e.g. high signal level) when the control signal T_COMP has the enable signal level (e.g. high signal level), the second temperature signal T2C is higher than the threshold, the first temperature signal T1C, the third temperature signal T3C and the fourth temperature signal T4C are lower than the threshold, and the operation temperature of the current mirror circuit 120 is higher than the second temperature T2.

As described in Table 1, FIG. 1 and FIG. 5, the enable signal TEMPC_EN generated by the operation circuit 130 in FIG. 1 has the enable signal level (e.g. high signal level) when the control signal T_COMP has the enable signal level (e.g. high signal level), the third temperature signal T3C is higher than the threshold, the first temperature signal T1C, the second temperature signal T2C and the fourth temperature signal T4C are lower than the threshold, and the operation temperature of the current mirror circuit 120 is higher than the third temperature T3.

As described in Table 1, FIG. 1 and FIG. 5, the enable signal TEMPC_EN generated by the operation circuit 130 in FIG. 1 has the enable signal level (e.g. high signal level) when the control signal T_COMP has the enable signal level (e.g. high signal level), the fourth temperature signal T4C is higher than the threshold, the first temperature signal T1C, the second temperature signal T2C and the third temperature signal T3C are lower than the threshold, and the operation temperature of the current mirror circuit 120 is higher than the fourth temperature T4.

TABLE 1

| Corresponding to the first temperature (e.g. 60° C.) The first temperature signal T1C | Corresponding to the second temperature (e.g. 75° C.) The second temperature signal T2C | Corresponding to the third temperature (e.g. 90° C.) The third temperature signal T1C | Corresponding to the fourth temperature (e.g. 105° C.) The fourth temperature signal T4C | Conditions where the enable signal TEMPC_EN has the enable signal level |
|---|---|---|---|---|
| Higher than the threshold | Lower than the threshold | Lower than the threshold | Lower than the threshold | When an operation temperature is higher than the first temperature T1 |
| Lower than the threshold | Higher than the threshold | Lower than the threshold | Lower than the threshold | When the operation temperature is higher than the second temperature T2 |
| Lower than the threshold | Lower than the threshold | Higher than the threshold | Lower than the threshold | When the operation temperature is higher than the third temperature T3 |
| Lower than the threshold | Lower than the threshold | Lower than the threshold | Higher than the threshold | When the operation temperature is higher than the fourth temperature T4 |
| Higher than the threshold | Higher than the threshold | Higher than the threshold | Higher than the threshold | When the operation temperature is higher than the predetermined temperature (e.g. 40° C.) |

As described in Table 1, FIG. 1 and FIG. 5, the enable signal TEMPC_EN generated by the operation circuit 130 in FIG. 1 can have the enable signal level (e.g. high signal level) when the control signal T_COMP has the enable As described in Table 1, FIG. 1 and FIG. 5, the enable signal TEMPC_EN generated by the operation circuit 130 in FIG. 1 has the enable signal level (e.g. high signal level) when the control signal T_COMP has the enable signal level (e.g. high signal level), the first temperature signal TIC, the second temperature signal T2C, the third temperature signal T3C and the fourth temperature signal T4C are higher than the threshold, and the operation temperature of the current mirror circuit 120 is higher than the predetermined temperature (e.g. 40° C.).

When one of the first temperature signal TIC, the second temperature signal T2C, the third temperature signal T3C and the fourth temperature signal T4C is higher than the threshold, the signal can have an enable signal level. The enable signal level(s) of the first temperature signal TIC, the second temperature signal T2C, the third temperature signal T3C, the fourth temperature signal T4C, the control signal T_COMP and the enable signal TEMPC_EN can be the same or different.

In FIG. 5, regarding the sizes of the transistors, the second transistor 525 can be larger than the third transistor 535, the third transistor 535 can be larger than the fourth transistor 545, and the fourth transistor 545 can be larger than the fifth transistor 555.

The number of the transistors and the number of switches in FIG. 5 are examples. The number of the transistors and the number of switches can be adjusted according to requirements for controls of more temperature ranges. For example, if more transistors and switches are used, controls of more temperature ranges can be performed in Table 1. For example, Table 1 may further include a fifth temperature signal corresponding to a fifth temperature for related controls.

Figure 6:
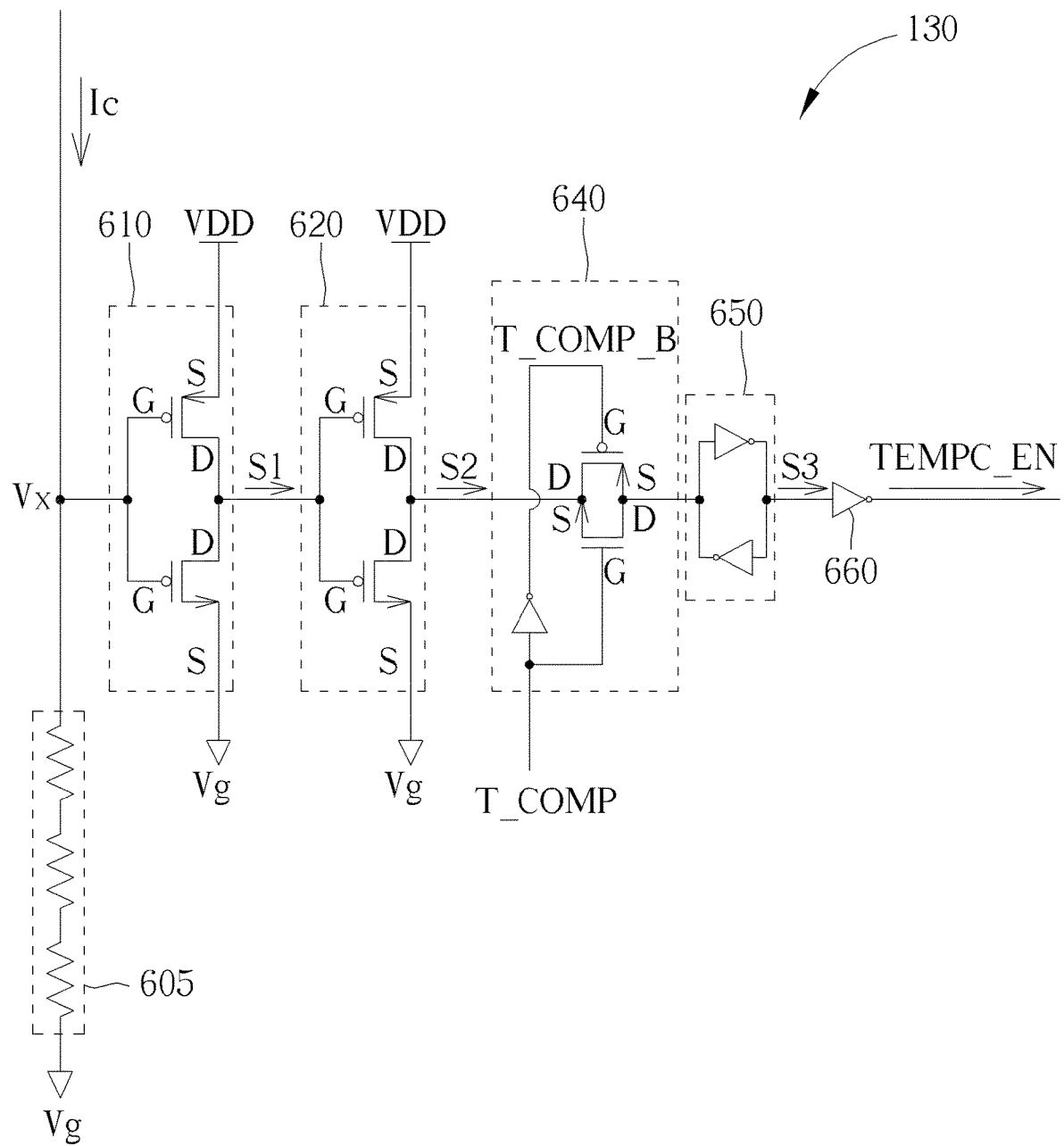
FIG. 6 illustrates the operation circuit in FIG. 1.

FIG. 6 illustrates the operation circuit 130 in FIG. 1. The operation circuit 130 can include a resistance unit 605, a first invertor 610, a second invertor 620 and a switch 640. Optionally, the operation circuit 130 can further include a register 650 and a third invertor 660. As show in FIG. 1 and FIG. 6, the resistance unit 605 can include a first terminal and a second terminal, where the first terminal can be coupled to the first terminal of the operation circuit 130 to receive the control current Ic, and the second terminal can be coupled to the first reference voltage terminal to receive the first reference voltage Vg.

The first invertor 610 can include an input terminal and an output terminal, where the input terminal can be coupled to the first terminal of the resistance unit 605, and the output terminal can be used to output a first signal S1. When the control current Ic is higher than the predetermined value, the voltage Vx generated by the control current Ic and the resistance of the resistance unit 605 can exceed a threshold voltage of a transistor (e.g. N-type transistor) in the first invertor 610, and hence the first invertor 610 can generate the first signal S1.

The second invertor 620 can include an input terminal and an output terminal, where the input terminal can be coupled to the output terminal of the first invertor 610, and the output terminal can be used to output a second signal S2 complementary with the first signal S1.

The switch 640 can include a first terminal, a second terminal and a control terminal, where the first terminal can be coupled to the output terminal of the second invertor 620 to receive the second signal S2, and the control terminal can be used to receive the control signal T_COMP. When the control signal T_COMP has the enable signal level (e.g. high signal level), the switch 640 can be turned on, and the second terminal of the switch 640 can output the second signal S2.

The register 650 can include an input terminal and an output terminal, where the input terminal can be coupled to the second terminal of the switch 640, and the output terminal can be used to output a third signal S3 according to the second signal S2. For example, the third signal S3 can be complementary with the second signal S2.

The third invertor 660 can include an input terminal and an output terminal, where the input terminal can be coupled to the output terminal of the register 650, and the output terminal can be used to output the enable signal TEMPC_EN according to the third signal S3. For example, the enable signal TEMPC_EN can be complementary with the third signal S3

In FIG. 6, the voltage Vx can be generated according to the control current Ic and the resistance unit 605, and the enable signal TEMPC_EN can have the enable signal level (e.g. high signal level) when the voltage Vx is higher than a threshold voltage of a transistor (e.g. N-type transistor) of the first invertor 610.

Each of the first invertor 610, the second invertor 620 and the third invertor 660 can include two transistors (e.g. a P-type transistor and an N-type transistor), and the couplings of the components can be as shown in FIG. 6. As shown in FIG. 6, the switch 640 can include an invertor and two transistors (e.g. a P-type transistor and an N-type transistor). As shown in FIG. 6, the register 650 can include two invertors to store a signal.

By adjusting the resistance of the resistance unit 605, a threshold current can be determined. When the control current Ic reaches the threshold current, the enable signal TEMPC_EN can have the enable signal level (e.g. high signal level).

Figure 7:
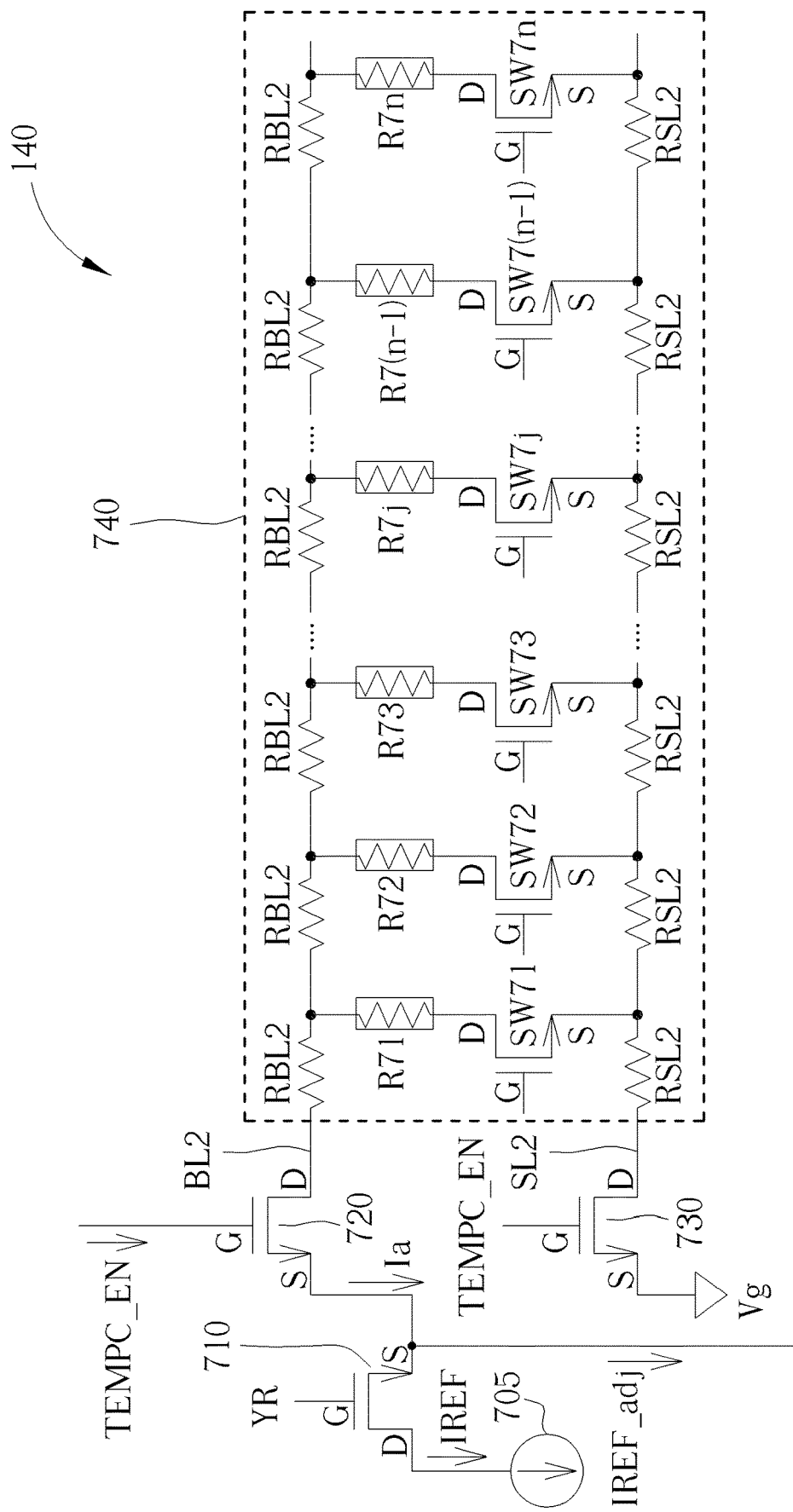
FIG. 7 illustrates the reference current adjustment circuit in FIG. 1.

FIG. 7 illustrates the reference current adjustment circuit 140 in FIG. 1. The reference current adjustment circuit 140 can include a current source 705, a first switch 710, a second switch 720, a third switch 730 and a dummy memory row 740.

The current source 705 can be used to provide the reference current IREF. The first switch 710 can include a first terminal, a second terminal and a control terminal, where the first terminal can be coupled to the current source 705, the control terminal can receive a signal YR to turn on or turn off the first switch 710, and the second terminal can be used to output the updated reference current IREF_adj.

The second switch 720 can include a first terminal, a control terminal and a second terminal, where the first terminal can be coupled to the second terminal of the first switch 710, and the control terminal coupled to the second terminal of the operation circuit 130 to receive the enable signal TEMPC_EN.

The third switch 730 can include a first terminal, a control terminal and a second terminal, where the control terminal can be coupled to the second terminal of the operation circuit 130 to receive the enable signal TEMPC_EN.

The dummy memory row 740 can be used to generate the adjustment current Ia. The dummy memory row 740 can include a second bit line BL2, a second source line SL2, n resistive memory cells R71 to R7$n$, and $n$ sub-switches SW71 to SW7$n$. The second bit line BL2 can be coupled to the second terminal of the second switch 720. The second source line SL2 can be coupled to the second terminal of the third switch 730. A jth resistive memory cell R7$j$ and a jth sub-switch SW7$j$ can be coupled in series between the second bit line BL2 and the second source line SL2, n and j are integers, and 0<j≤n. As shown in FIG. 7, on the second bit line BL2, resistors RBL2 can be disposed, and each resistor RBL2 other than the first one can be coupled to terminals of two resistive memory cells. On the second source line SL2, resistors RSL2 can be disposed, and each resistor RSL2 other than the first one can be coupled to terminals of two sub-switches.

In FIG. 7, the n sub-switches SW71 to SW7n can be turned off. Hence, the adjustment current 1a can be a leakage current of the dummy memory row 740. When the operation temperature around the memory control circuit 100 increases, the adjustment current 1a can rise accordingly, and the updated reference current IREF_adj can rise with the increasing temperature. As a result, the updated reference current IREF_adj can be compensated when the temperature varies as shown in FIG. 2.

According to an embodiment, the memory 190 in FIG. 1, the leakage current generation circuit 1108 in FIG. 3 and the dummy memory row 740 in FIG. 7 can include arrays formed of the same resistive random access memory (RRAM) cells.

According to an embodiment, the number of RRAM cells in the memory 190 can be the same as the number of RRAM cells in the dummy memory row 740. Hence, temperature compensation of the leakage current for the memory 190 can be performed. As mentioned above, the leakage current generation circuit 1108 can include an array formed of RRAM cells. According to an embodiment, the numbers of RRAM cells in the leakage current generation circuit 1108, the memory 190 and the dummy memory row 740 can be the same. According to another embodiment, the number of RRAM cells in the leakage current generation circuit 1108 can be different from the number of RRAM cells in the memory 190 and the dummy memory row 740.

In summary, by using the memory control circuit 100 provided by embodiments, when the temperature changes, the updated reference current IREF_adj can vary with the temperature. As a result, the accuracy of reading the memory 190 in FIG. 1 is improved by reading the memory 190 according to the updated reference current IREF_adj, and the reliability after multiple memory accesses is accordingly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory control circuit comprising:
   a leakage current providing circuit configured to generate a leakage current, and comprising a first terminal configured to receive a control signal, and a second terminal configured to provide the leakage current when the control signal has a first enable signal level;
   a current mirror circuit configured to generate a control current according to the leakage current, the current mirror circuit comprising a first terminal coupled to the second terminal of the leakage current providing circuit, and a second terminal configured to output the control current;
   an operation circuit configured to generate an enable signal, the operation circuit comprising a first terminal coupled to the second terminal of the current mirror circuit, and a second terminal configured to output the enable signal, wherein the enable signal has a second enable signal level when the control current is larger than a predetermined value; and
   a reference current adjustment circuit coupled to the second terminal of the operation circuit and configured to generate an updated reference current according to a reference current and an adjustment current when the enable signal has the second enable signal level;
   wherein a resistance of a memory is determined according to the updated reference current.

2. The memory control circuit of claim 1, wherein the resistance of the memory is determined as a low resistance if a measured current corresponding to the resistance of the memory is higher than the updated reference current.

3. The memory control circuit of claim 1, wherein the resistance of the memory is determined as a high resistance if a measured current corresponding to the resistance of the memory is lower than the updated reference current.

4. The memory control circuit of claim 1, wherein the leakage current providing circuit further comprises:
   a switch comprising a control terminal coupled to the first terminal of the leakage current providing circuit and configured to receive the control signal, a first terminal, and a second terminal coupled to a first reference voltage terminal; and
   a leakage current generation circuit configured to generate the leakage current, the leakage current generation circuit comprising a first terminal coupled to the first terminal of the switch, and a second terminal coupled to the second terminal of the leakage current providing circuit.

5. The memory control circuit of claim 4, wherein the leakage current generation circuit further comprises:
   a first source line coupled to the switch of the leakage current generation circuit;
   a first bit line coupled to the second terminal of the leakage current generation circuit;
   m resistive memory cells; and
   m sub-switches;
   wherein an ith resistive memory cell and an ith sub-switch are coupled in series between the first source line and the first bit line, m and i are integers, and 0<i≤m.

6. The memory control circuit of claim 1, wherein the current mirror circuit further comprises:
   a first switch comprising a control terminal configured to receive the control signal, a first terminal, and a second terminal coupled to the first terminal of the current mirror circuit;
   a first transistor comprising a first terminal coupled to a second reference voltage terminal, a second terminal coupled to the first terminal of the first switch, and a control terminal coupled to the second terminal of the first transistor;
   a second transistor comprising a first terminal coupled to the second reference voltage terminal, a second terminal, and a control terminal coupled to the control terminal of the first transistor; and
   a second switch comprising a first terminal coupled to the second terminal of the second transistor, a second terminal coupled to the second terminal of the current mirror circuit, and a control terminal configured to receive a temperature signal;
   wherein the first switch is turned on when the control signal has the first enable signal level; and
   the second switch is turned on and the current mirror circuit generates the control current when the temperature signal has a third enable signal level.

7. The memory control circuit of claim 1, wherein the current mirror circuit further comprises:
   a first switch comprising a control terminal configured to receive the control signal, a first terminal, and a second terminal coupled to the first terminal of the current mirror circuit;

a first transistor comprising a first terminal coupled to a second reference voltage terminal, a second terminal coupled to the first terminal of the first switch, and a control terminal coupled to the second terminal of the first transistor;

a second transistor comprising a first terminal coupled to the second reference voltage terminal, a second terminal, and a control terminal coupled to the control terminal of the first transistor; and a second switch comprising a first terminal coupled to the second terminal of the second transistor, a second terminal coupled to the second terminal of the current mirror circuit, and a control terminal configured to receive a first temperature signal;

a third transistor comprising a first terminal coupled to the second reference voltage terminal, a second terminal, and a control terminal coupled to the control terminal of the first transistor; and a third switch comprising a first terminal coupled to the second terminal of the third transistor, a second terminal coupled to the second terminal of the current mirror circuit, and a control terminal configured to receive a second temperature signal;

a fourth transistor comprising a first terminal coupled to the second reference voltage terminal, a second terminal, and a control terminal coupled to the control terminal of the first transistor; and a fourth switch comprising a first terminal coupled to the second terminal of the fourth transistor, a second terminal coupled to the second terminal of the current mirror circuit, and a control terminal configured to receive a third temperature signal;

a fifth transistor comprising a first terminal coupled to the second reference voltage terminal, a second terminal, and a control terminal coupled to the control terminal of the first transistor; and a fifth switch comprising a first terminal coupled to the second terminal of the fifth transistor, a second terminal coupled to the second terminal of the current mirror circuit, and a control terminal configured to receive a fourth temperature signal;

wherein the first temperature signal, the second temperature signal, the third temperature signal and the fourth temperature signal are corresponding to a first temperature, a second temperature, a third temperature and a fourth temperature respectively.

8. The memory control circuit of claim 7, wherein:

the first temperature is lower than the second temperature, the second temperature is lower than the third temperature, and the third temperature is lower than the fourth temperature; and the enable signal has the second enable signal level when the control signal has the first enable signal level, the first temperature signal is higher than a threshold, the second temperature signal, the third temperature signal and the fourth temperature signal are lower than the threshold, and an operation temperature is higher than the first temperature.

9. The memory control circuit of claim 7, wherein:

the first temperature is lower than the second temperature, the second temperature is lower than the third temperature, and the third temperature is lower than the fourth temperature; and the enable signal has the second enable signal level when the control signal has the first enable signal level, the second temperature signal is higher than a threshold, the first temperature signal, the third temperature signal and the fourth temperature signal are lower than the threshold, and an operation temperature is higher than the second temperature.

10. The memory control circuit of claim 7, wherein:

the first temperature is lower than the second temperature, the second temperature is lower than the third temperature, and the third temperature is lower than the fourth temperature; and the enable signal has the second enable signal level when the control signal has the first enable signal level, the third temperature signal is higher than a threshold, the first temperature signal, the second temperature signal and the fourth temperature signal are lower than the threshold, and an operation temperature is higher than the third temperature.

11. The memory control circuit of claim 7, wherein:

the first temperature is lower than the second temperature, the second temperature is lower than the third temperature, and the third temperature is lower than the fourth temperature; and the enable signal has the second enable signal level when the control signal has the first enable signal level, the fourth temperature signal is higher than a threshold, the first temperature signal, the second temperature signal and the third temperature signal are lower than the threshold, and an operation temperature is higher than the fourth temperature.

12. The memory control circuit of claim 7, wherein:

the first temperature is lower than the second temperature, the second temperature is lower than the third temperature, and the third temperature is lower than the fourth temperature; and the enable signal has the second enable signal level when the control signal has the first enable signal level, the first temperature signal, the second temperature signal, the third temperature signal and the fourth temperature signal are higher than a threshold, and an operation temperature is higher than a predetermined temperature.

13. The memory control circuit of claim 7, wherein the second transistor is larger than the third transistor, the third transistor is larger than the fourth transistor, and the fourth transistor is larger than the fifth transistor.

14. The memory control circuit of claim 1, wherein the operation circuit further comprises:

a resistance unit comprising a first terminal coupled to the first terminal of the operation circuit, and a second terminal coupled to a first reference voltage terminal;

a first invertor comprising an input terminal coupled to the first terminal of the resistance unit, and an output terminal configured to output a first signal, wherein the first invertor generates the first signal when the control current is higher than the predetermined value;

a second invertor comprising an input terminal coupled to the output terminal of the first invertor, and an output terminal configured to output a second signal complementary with the first signal; and a switch comprising a first terminal coupled to the output terminal of the second invertor, a second terminal, and a control terminal configured to receive the control signal, wherein the switch is turned on when the control signal has the first enable signal level;

wherein a voltage is generated according to the control current and the resistance unit, and the enable signal has the second enable signal level when the voltage is higher than a threshold voltage of the first invertor.

15. The memory control circuit of claim 14, wherein the operation circuit further comprises:
- a register comprising an input terminal coupled to the second terminal of the switch, and an output terminal configured to output a third signal according to the second signal; and
- an third invertor comprising an input terminal coupled to the output terminal of the register, and an output terminal configured to output the enable signal according to the third signal.

16. The memory control circuit of claim 1, wherein the reference current adjustment circuit further comprises:
- a current source configured to provide the reference current;
- a first switch comprising a first terminal coupled to the current source, a control terminal, and a second terminal configured to output the updated reference current;
- a second switch comprising a first terminal coupled to the second terminal of the first switch, a control terminal coupled to the second terminal of the operation circuit, and a second terminal;
- a third switch comprising a first terminal, a control terminal coupled to the second terminal of the operation circuit, and a second terminal;
- a dummy memory row configured to generate the adjustment current, the dummy memory row comprising:
  - a second bit line coupled to the second terminal of the second switch;
  - a second source line coupled to the second terminal of the third switch;
  - n resistive memory cells; and
  - n sub-switches;
  - wherein a jth resistive memory cell and a jth sub-switch are coupled in series between the second bit line and the second source line, n and j are integers, $0<j\leq n$.

17. The memory control circuit of claim 16, wherein the n sub-switches are turned off.

* * * * *